United States Patent
Chen et al.

(10) Patent No.: US 11,756,597 B2
(45) Date of Patent: Sep. 12, 2023

(54) POWER-ON READ DEMARCATION VOLTAGE OPTIMIZATION

(71) Applicant: Micron Technology, Inc., Boise, ID (US)

(72) Inventors: Mikai Chen, Sunnyvale, CA (US); Zhenlei Shen, Milpitas, CA (US); Murong Lang, San Jose, CA (US); Zhenming Zhou, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/393,112

(22) Filed: Aug. 3, 2021

(65) Prior Publication Data

US 2023/0043775 A1   Feb. 9, 2023

(51) Int. Cl.
*G11C 7/20* (2006.01)
*G11C 5/14* (2006.01)
*G11C 11/4096* (2006.01)
*G11C 7/10* (2006.01)

(52) U.S. Cl.
CPC ............ *G11C 7/20* (2013.01); *G11C 5/148* (2013.01); *G11C 7/1063* (2013.01); *G11C 11/4096* (2013.01)

(58) Field of Classification Search
CPC ......... G11C 7/20; G11C 7/1063; G11C 5/148; G11C 11/4096
See application file for complete search history.

(56) References Cited

U.S. PATENT DOCUMENTS

| | | |
|---|---|---|
| 2014/0006696 A1 | 1/2014 | Ramanujan |
| 2017/0372780 A1 | 12/2017 | Qawami |
| 2019/0043571 A1 | 2/2019 | Damle |
| 2019/0325956 A1 | 10/2019 | Bradshaw |
| 2020/0081864 A1* | 3/2020 | Roberts ............... G06F 13/1673 |
| 2020/0168272 A1* | 5/2020 | Ji ........................ G11C 11/5642 |
| 2021/0165734 A1 | 6/2021 | Chung |

FOREIGN PATENT DOCUMENTS

| | | | | |
|---|---|---|---|---|
| CN | 112051966 A | * | 12/2020 | ............ G06F 11/076 |
| JP | 2004253093 A | * | 9/2004 | ............ G11C 16/10 |
| KR | 20180023190 A | * | 3/2018 | |

OTHER PUBLICATIONS

International Preliminary Search Report for International application No. PCT/US2022/039203, dated Nov. 4, 2022, 9 pages.

* cited by examiner

*Primary Examiner* — Sultana Begum
(74) *Attorney, Agent, or Firm* — LOWENSTEIN SANDLER LLP

(57) ABSTRACT

A system includes a memory device having memory cells and a processing device operatively coupled to the memory device. The processing device is to perform operations including: determining a length of time the memory device has been powered off; and in response to determining that the length of time satisfies a threshold value: for each of multiple groups of memory cells, asserting a corresponding flag; determining, based on the length of time, one or more adjusted demarcation voltages to be used in reading a state of the multiple groups of memory cells; and storing the one or more adjusted demarcation voltages for use in performing memory operations.

20 Claims, 6 Drawing Sheets

POWER-ON READ DEMARCATION VOLTAGE OPTIMIZATION

TECHNICAL FIELD

Embodiments of the disclosure relate generally to memory sub-systems, and more specifically, relate to power-on read demarcation voltage optimization.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
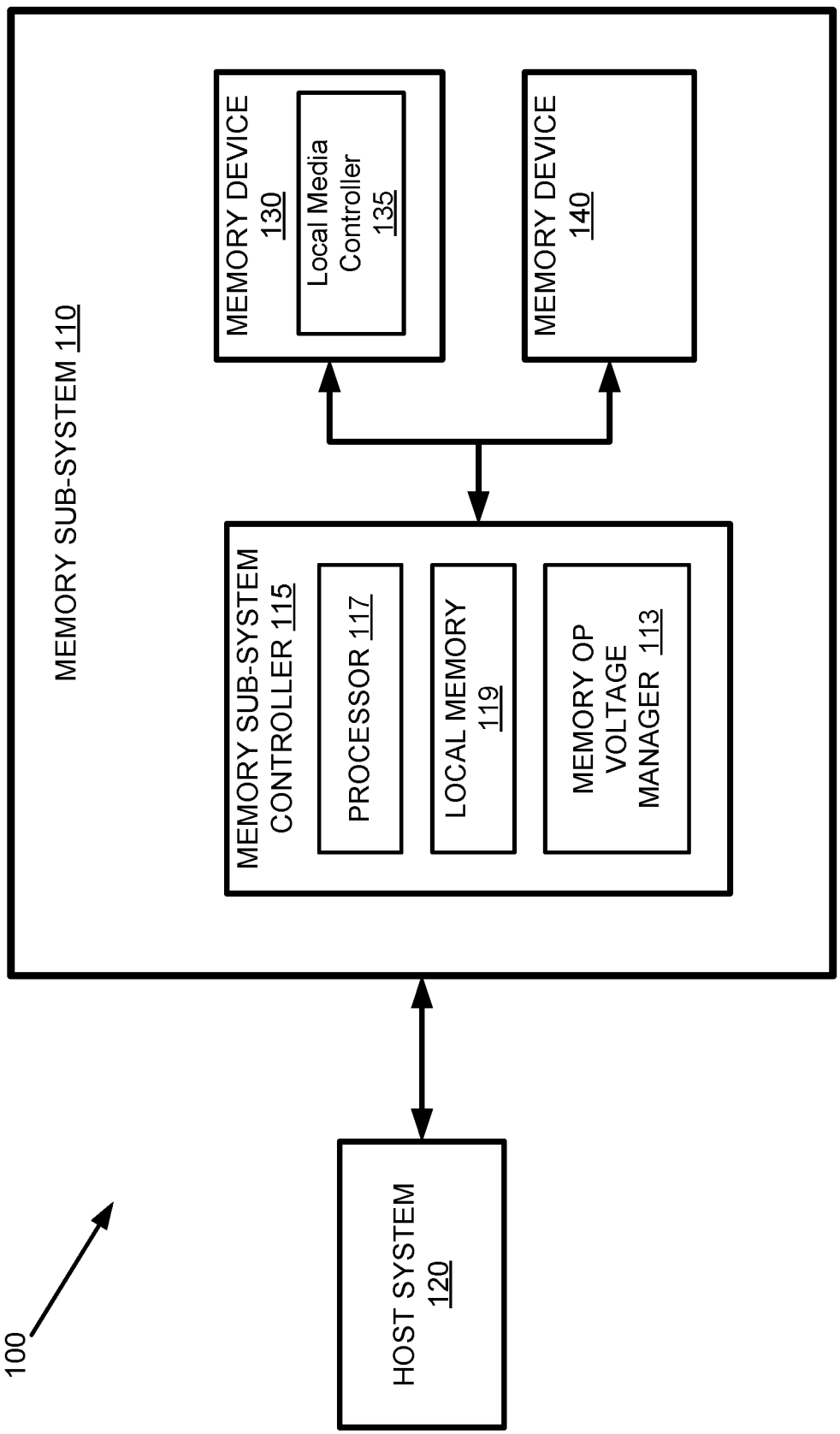
FIG. 1 illustrates an example computing environment that includes a memory sub-system in accordance with some embodiments.

Aspects of the present disclosure are directed to power-on read demarcation voltage optimization. A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components, such as memory devices that store data. The host system can provide data to be stored at the memory sub-system and can request data to be retrieved from the memory sub-system.

The memory components can include non-volatile memory devices that store data from the host system. A non-volatile memory device is a package of one or more dice. The dice in the packages can be assigned to one or more channels for communicating with a memory sub-system controller. The non-volatile memory devices include cells (i.e., electronic circuits that store information), that are grouped into pages to store bits of data. The non-volatile memory devices can include three-dimensional cross-point ("3D cross-point") memory devices that are a cross-point array of non-volatile memory that can perform bit storage based on a change of bulk resistance, in conjunction with a stackable cross-gridded data access array. Another example of a non-volatile memory device is a negative-and (NAND) memory device. Other examples of non-volatile memory devices are described below in conjunction with FIG. 1.

Each of the memory devices can include one or more arrays of memory cells. A memory cell ("cell") is an electronic circuit that stores information. Depending on the cell type, a cell can store one or more bits of binary information, and has various logic states that correlate to the number of bits being stored. The logic states can be represented by binary values, such as "0" and "1," or combinations of such values. For example, a single level cell (SLC) can store one bit of information and has two logic states. The various logic states have corresponding threshold voltage levels. A threshold voltage (Vt) is the voltage applied to the cell circuitry (e.g., control gate at which a transistor becomes conductive) to set the state of the cell. A cell is set to one of its logic states based on the Vt that is applied to the cell. For example, if a high Vt is applied to an SLC, a charge will be present in the cell, setting the SLC to store a logic 0. If a low Vt is applied to the SLC, charge will be absent in the cell, setting the SLC to store a logic 1.

The demarcation voltage (or voltage demarcation (VDM) level) can be a particular voltage that is applied to memory cells of a memory component to read the data stored at the memory cells. For example, if a threshold voltage (Vt) of a particular memory cell is identified as being below the demarcation voltage (e.g., VDM level) that is applied to the particular memory cell, then the data stored at the particular memory cell can be read as a particular value (e.g., a logical '1') or determined to be in a particular state (e.g., a set state). If the threshold voltage of the particular memory cell is identified as being above the demarcation voltage, then the data stored at the particular memory cell can be read as another value (e.g., a logical '0') or determined to be in another state (e.g., a reset state). Thus, the demarcation voltage can be applied to memory cells to determine values stored at the memory cells.

The threshold voltage or the threshold voltage distribution of multiple memory cells can shift over time, also referred to as voltage threshold drift. This drift in threshold voltage can be particularly pronounced when a memory device of the memory sub-system has been powered off for some period of time. When the threshold voltage of a memory cell changes, the application of the demarcation voltage can be inaccurate relative to the changed threshold voltage. For example, when the demarcation voltage is applied to the memory cell, the data stored at the memory cell can be misread or misinterpreted to be at a wrong value as compared to the value as originally stored when the threshold voltage had not yet shifted. While some memory sub-systems can be designed to try consecutively higher demarcation voltages to try to locate the correct demarcation voltage, e.g., relative to the shifted threshold voltage levels, these attempts are limited to few (e.g., 2-4) total demarcation voltages. In some situations, the memory device is powered off long enough that a read error (e.g., E2 error) occurs when attempting to read a memory cell (or a distribution of memory cells) using a set of inaccurate demarcation voltages relative to the drifted threshold voltage.

In certain memory sub-systems, to prevent read errors after a memory device or sub-system is powered on, a power-on scrub (e.g., re-write of data in memory cells) is performed that writes system management units (e.g., groups of memory cells such as a page or a physical block of memory cells) one by one until each group of memory cells is refreshed (for both mapped and free system management units). A full-scale power-on scrub, however, reduces product performance during the power-up transient stage. Further, power-up write scrub jobs can be allocated with a relatively low priority compared to host operations, and thus take a longer time and extend the power-up transient period during which a memory sub-system will noticeably suffer in performance.

In certain memory sub-systems, to prevent read errors after a memory device or sub-system is powered on, a drift time is determined based on a time stamp for the group of memory cells that is being accessed for performing a memory operation, e.g., the time stamp for a current read operation minus the time stamp for the last time the group of memory cells was written. The demarcation voltage used for the read operation can be adjusted if the drift time exceeds a certain threshold value. This approach, while allowing accurate determination of the demarcation voltage for a particular group of memory cells, is resource intensive due to the need to track time stamps for each group of memory cells. The additional resources can affect performance negatively as well.

Aspects of the present disclosure address the above and other deficiencies by adapting a memory sub-system to adjust one or more demarcation voltages based on the duration of time the memory sub-system (or memory device of the memory sub-system) has been powered off. More specifically, a memory controller (e.g., processing device) can determine a length of time the memory device has been powered off such as by accessing a system-level time stamp associated with the most recent power-off event. The controller can further set to a first level (e.g., asserted), for each group of multiple groups of memory cells, a corresponding flag indicating that each group of memory cells is associated with the most recent power-off event. Assertion of the flags for respective groups of memory cells can be performed with a single operation, for example.

In various embodiments, the controller can then determine, based on the length of time the memory device has been powered off, one or more adjusted demarcation voltages to be used in reading a state of the memory cells within the multiple groups of memory cells. The memory controller can store these adjusted demarcation voltage(s) for use in performing host memory operations. In this way, no individual time stamps are needed and the flags can be the trigger for whether or not to use the adjusted demarcation voltages. For example, after a group of memory cells is freshly written, the flag associated with the group of memory cells can be set to a second level (e.g., deasserted) and the default demarcation voltages can be applied to that group of memory cells in the future.

Advantages of the present disclosure include, but are not limited to, enhancing reliability of memory cells, preservation of data integrity, and improvement of power-up transient performance. As a result, fewer error correction operations need to be performed. For example, since the demarcation voltages are adjusted, the retrieved data can be reliably read with fewer errors. Further, the process by which adjusted demarcation voltages is determined and employed to prevent these errors is less resource intensive and avoids memory device performance degradation during the power-up transient stage. Moreover, the decreased error rate can result in decreased power consumption associated with error correction or recovery operations and can free system resources for other functionality, including but not limited to handling host operations. These are other advantages that would be apparent to those skilled in the art will be apparent from the following more detailed discussion.

FIG. 1 illustrates an example computing environment 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, a vehicle (e.g., airplane, drone, train, automobile, or other conveyance), Internet of Things (IoT) devices, or such computing device that includes a memory and a processing device. The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components, such as memory devices 130, when the memory sub-system 110 is coupled with the host system 120 by the PCIe interface. The physical host interface can provide an interface for passing control, address, data, and other signals between the memory sub-system 110 and the host system 120.

The memory devices can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased.

Although non-volatile memory components such as 3D cross-point type and NAND type memory are described, the memory device 130 can be based on any other type of non-volatile memory, such as read-only memory (ROM), phase change memory (PCM), magneto random access memory (MRAM), negative-or (NOR) flash memory, electrically erasable programmable read-only memory (EEPROM), and a cross-point array of non-volatile memory cells.

One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages or codewords that can refer to a logical unit of the memory device used to store data. With some types of memory (e.g., NAND), pages can be grouped to form blocks. Some types of memory, such as 3D cross-point, can group pages across dice and channels to form management units (MUs).

The memory sub-system controller 115 can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 may not include a memory sub-system controller 115, and may instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA, namespace) and a physical address (e.g., physical MU address, physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 includes a memory operation voltage manager 113 that can adjust read voltages (i.e., demarcation voltages) and otherwise direct the optimization of power-on read demarcation voltages used for reading from groups of memory cells after the memory sub-system 110 (and/or the memory device 130) is powered on, as described herein. In some embodiments, the memory sub-system controller 115 includes at least a portion of the memory operation voltage manager 113. For example, the memory sub-system controller 115 can include a processor 117 (processing device) configured to execute instructions stored in local memory 119 for performing the operations described herein. In some embodiments, the memory operation voltage manager 113 is part of the host system 110, an application, or an operating system.

Figure 2:
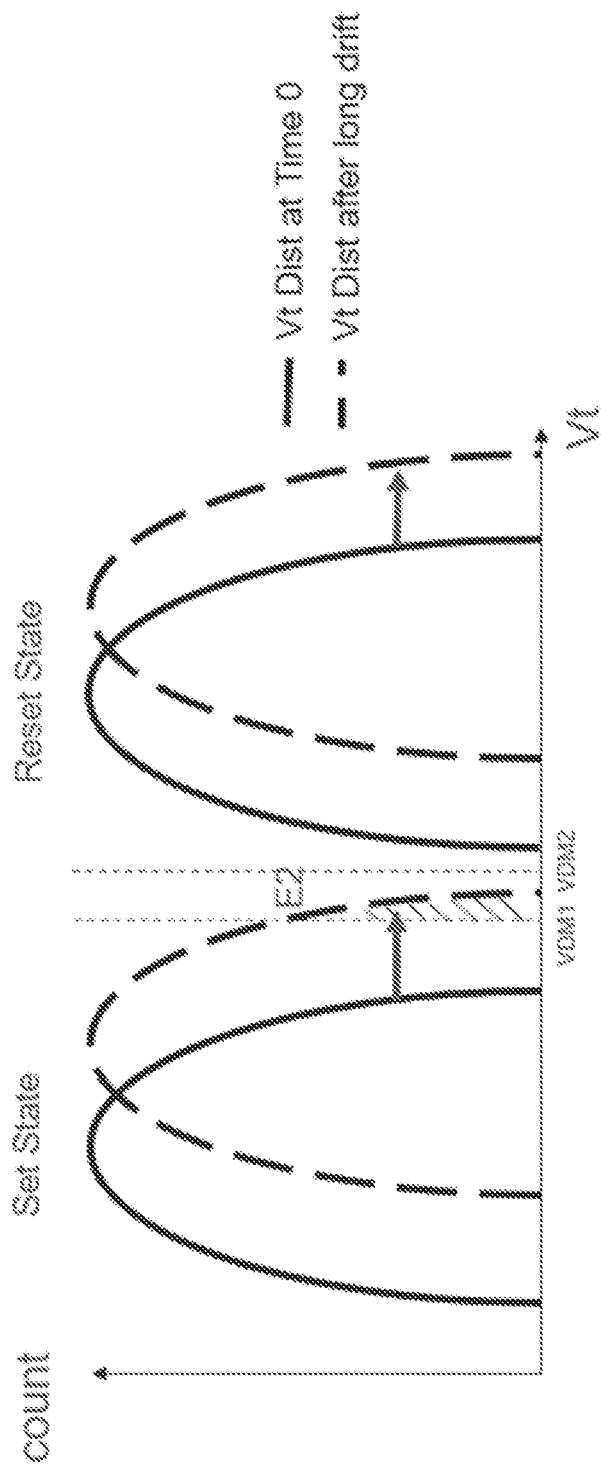
FIG. 2 is a graph illustrating error in demarcation voltages relative to threshold voltage distributions for set and reset states of three-dimensional (3D) cross-point memory after a long drift period in accordance with some embodiments.

FIG. 2 is a graph illustrating error in demarcation voltages relative to threshold voltage distributions for set and reset states of three-dimensional (3D) cross-point memory after a long drift period in accordance with some embodiments. After a certain drift period, e.g., such as 5, hours, 10 hours, 15 hours, or other similar length of time, each of the set threshold voltage distribution (on the left) and the reset threshold state voltage distribution (on the right) of a group of memory cells have shifted to the right, e.g., towards increasing threshold voltage levels. Because of this threshold voltage distribution drift, the first demarcation voltage (VDM1) now is inaccurate, as being too low. Thus, a second demarcation voltage (VDM2) would need to be used in order to avoid a read error, designated as E2, for reading the set state threshold voltage distribution. The reset state threshold voltage distribution exhibits similar behavior. In some embodiments, there can be a number of intermediate demarcation voltage levels between VDM1 and VDM2, and thus conventional methods may not reach the VDM2 demarcation voltage as an alternative. Each time a read operation flow is performed to endeavor to find a subsequent demarcation voltage such as VDM2 that will avoid generating a read error, operation latency is increased. This operational latency degrades memory device performance that is noticeable to a user, for example.

Thus, in some embodiments, the controller 115 (e.g., the memory operation voltage manager 113) can be programmed to optimize the determination and use of adjusted demarcation voltages for the groups of memory cells of the memory device 130. For example, the controller 115 can determine power-off time at a system level by accessing a system-level time stamp or other system-level clock value that provides the time of the most recent power-off event, e.g., at least at a die or memory device level. Once this power-off time is determined, the controller 115 can determine one or more adjusted demarcation voltages to be used for reading a state of the groups of memory cells. At least two ways of determining the one or more adjusted demarcation voltages is to access one of two sets of data, each of which can be embodied in a different curve or chart, as discussed with reference to FIGS. 3A-3B.

Figure 3B:
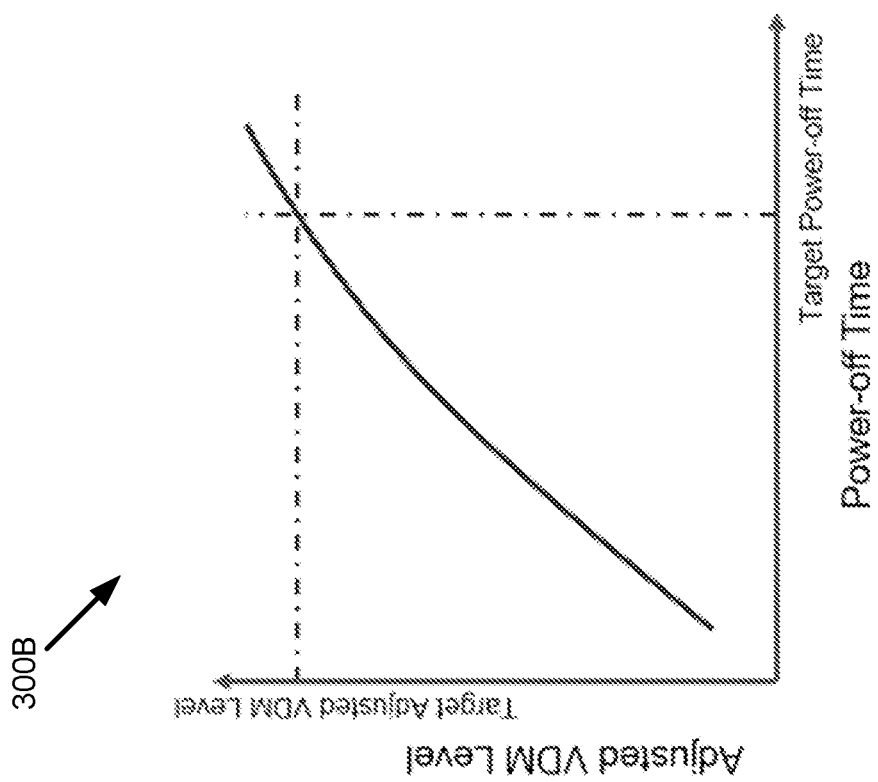
FIG. 3B is a graph illustrating a continuous curve that correlates power-off time of the memory device to any demarcation voltage located along the continuous curve in accordance with some embodiments.
Figure 3A:
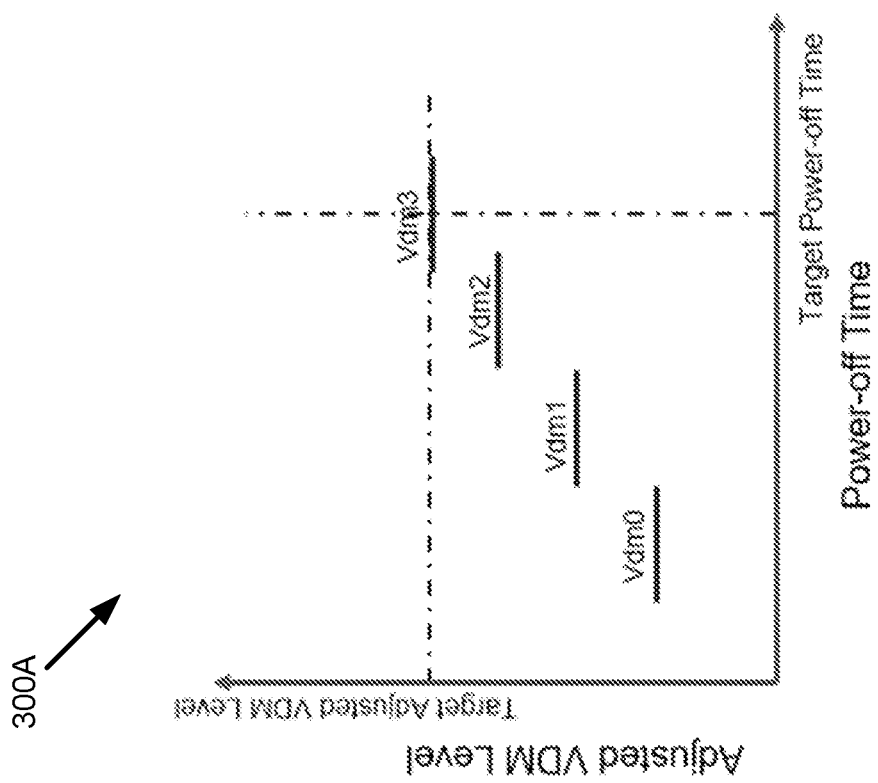
FIG. 3A is a graph illustrating a discontinuous curve that correlates power-off time of a memory device to a set of separated, discrete demarcation voltages in accordance with some embodiments.

FIG. 3A is a graph 300A illustrating a discontinuous curve that correlates power-off time of a memory device to a set of separated, discrete demarcation voltages in accordance with some embodiments. For example, the power-off time is illustrated along the x-axis and the adjusted demarcation voltages (or VDM levels) are illustrated along the y-axis. The data points along the y-axis for possible adjusted demarcation voltages, however, are limited, providing coarse levels to which power-off times will correspond. While a little less accurate, accessing the discontinuous curve (or data related thereto) of FIG. 3A can be used by a memory sub-system that is less sensitive to power drift while still being able to perform coarse adjustments without the more processing-intensive approach of FIG. 3B.

FIG. 3B is a graph 300B illustrating a continuous curve that correlates power-off time of the memory device to any demarcation voltage located along the continuous curve in accordance with some embodiments. As with graph 300A, this graph 300B also tracks the power-off time along the x-axis while tracking adjusted demarcation voltages (e.g., VDM levels) along the y-axis. The controller 115 may access the discontinuous curve of FIG. 3B in embodiments where the memory device 130 is more sensitive to drift and more precise values are to be employed for the adjusted demarcation voltages, e.g., where the additional processing resources are worth the added granularity in matching up a precise power-off time with a corresponding demarcation voltage along a continuous curve.

Figure 4:
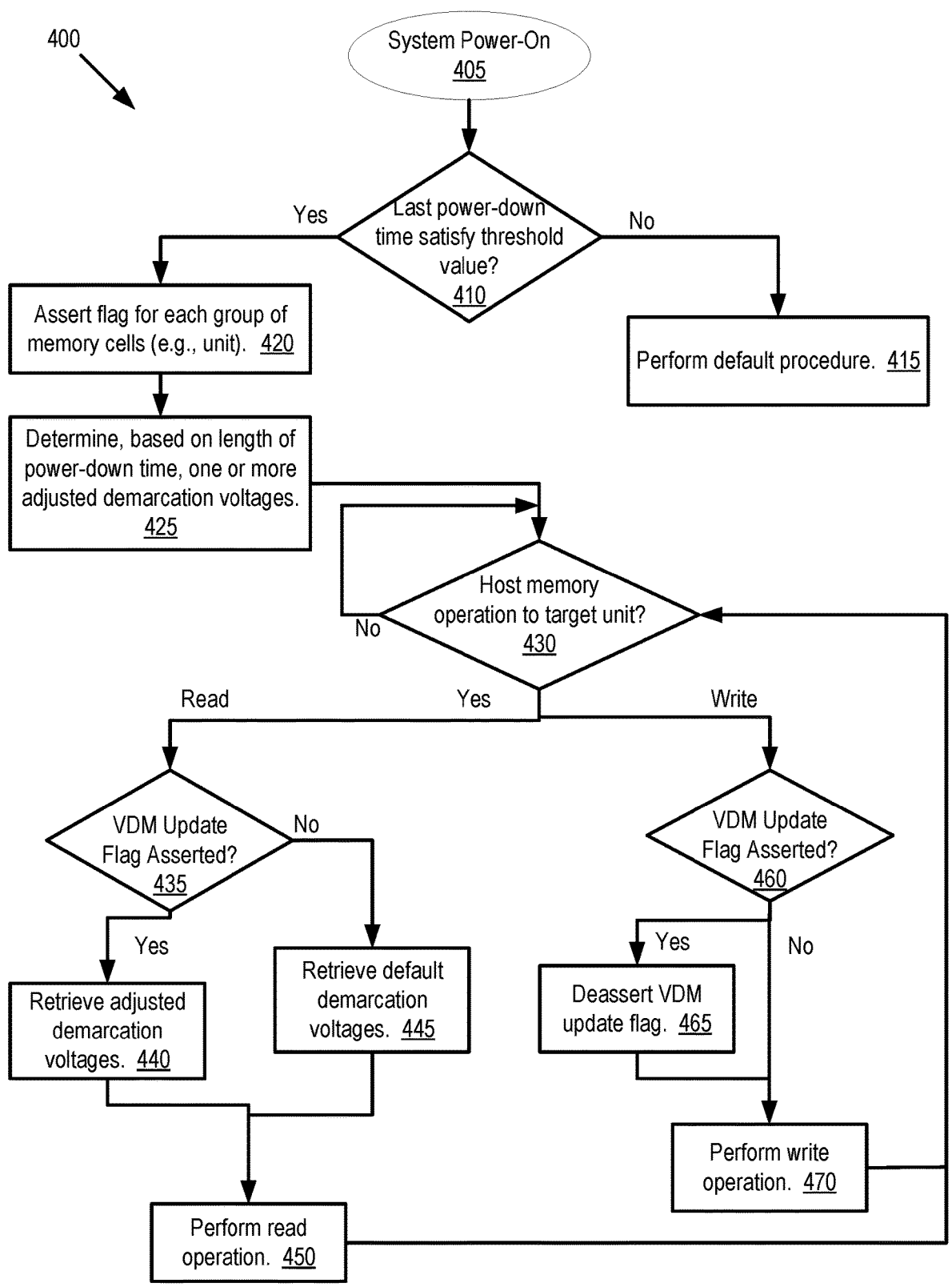
FIG. 4 a flow diagram of an example method for optimizing power-on read demarcation voltages in accordance with some embodiments.

FIG. 4 a flow diagram of an example method 400 for optimizing power-on read demarcation voltages in accordance with some embodiments. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the memory operation voltage manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 405, the memory sub-system 110 is powered on, to include the memory device 130. The memory sub-system controller 115 is also activated so that the memory operation voltage manager 113 can begin functioning.

At operation 410, the processing logic determines a last power-down time satisfies a threshold criterion value. In some embodiments, the threshold criterion value is to exceed a threshold time value. This power-down time can be understood as a length of time the memory device has been powered off, which can be determined with access to a system-level time stamp or clock at die or memory device level. Further, the threshold time value can change depending on the processing device and how resilient the memory device 130 is to drift, e.g., in terms of error rate. In some embodiments, the threshold time value can be 5 hours, 10 hours, 15 hours, or some other number of hours, inside of which the threshold voltage drifts are considered acceptable.

At operation 415, in response to the last power-down time not satisfying the threshold criterion, the processing logic performs a default procedure for determining the demarcation level for any given group of memory cells, e.g., a system management unit. A couple of these approaches were discussed previously, such as a complete scrub (e.g., re-write) of all the groups of memory cells, or other similarly resource-intensive approach.

At operation 420, in response to the last power-down time satisfying the threshold criterion, the processing logic, for each group of memory cells, asserts a corresponding flag. As discussed, this flag can be a VDM update flag for each group of memory cells that can be asserted in a single operation and thus need not be resource intensive. These flags set the stage for later tracking and can be stored in registers, buffers, or the like, to include optionally in the local memory 119 of the controller 115. In one embodiment, to "assert" refers to setting the flag to a logical value of one ("1") (e.g., a first level), in which case to "deassert" means to set the flag to a logical value of zero ("0") (e.g., a second level). In another embodiment, the term "assert" refers to setting the flag to a logical value of zero ("0") (e.g., first level), in which case to "deassert" means to set the flag to a logical value of one ("1") (e.g., second level).

At operation 425, the processing logic determines, based on the length of power-down time, one or more adjusted demarcation voltages. Thus, if the power-down time is just beyond the threshold value, the adjusted demarcation voltages will be significantly lower values compared to adjusted demarcation voltages based on the power-down time being five or ten times longer than the threshold value, for example. Operation 425 can also involve storing the one or more adjusted demarcation voltages for use in performing host memory operations during start-up.

At operation 430, the processing logic determines whether a host memory operation is directed to a target group of memory cells. The processing logic can parse the host memory operation to determine that it is a read operation, a write operation, or an erase operation, and read out of the memory operation (e.g., command) a target address. If there is no host memory operation, the method 400 loops backs and waits for the next host memory operation or command. While reference is made particularly to host operations herein, the method 400 would have the same flow for background memory operations as well.

At operation 435, in response to detecting a read operation from a host system, the processing logic determines whether the VDM update flag associated with the group of memory cells is asserted. If the flag is asserted, at operation 440, the processing logic retrieves the adjusted demarcation voltages that were determined (and stored) at operation 425. At operation 450, the processing logic performs the read operation using the one or more adjusted demarcation voltages.

If, however, at operation 435 the processing logic determines that the flag is not asserted, at operation 445, the processing logic retrieves default demarcation values. At operation 450, the processing logic performs the read operation using the default demarcation voltages.

If, at operation 430, the processing logic determines the host memory operation is a write operation, at operation 460, the processing logic determines whether the VDM update flag is asserted. If the flag is asserted, at operation 465, the processing logic deasserts the flag in conjunction with performing the write operation so that future read operations directed at the associated group of memory cells means use of the default demarcation voltages at operation 445. At operation 470, the processing logic performs the write operation. If, however, at operation 460 the VDM update flag is not asserted, the processing logic goes directly to operation 470 to perform the write operation, as the flag is not asserted.

In various embodiments, after each of performing a read operation (at operation 450) and performing a write operation (at operation 470), the method 400 loops back to operation 430 to wait on detecting a new incoming host operation (command). Over time, a number of newly written groups of memory cells will have deasserted flags associated with them, and so these groups of memory cells can be read, at operation 450, with the default demarcation voltages.

Figure 5A:
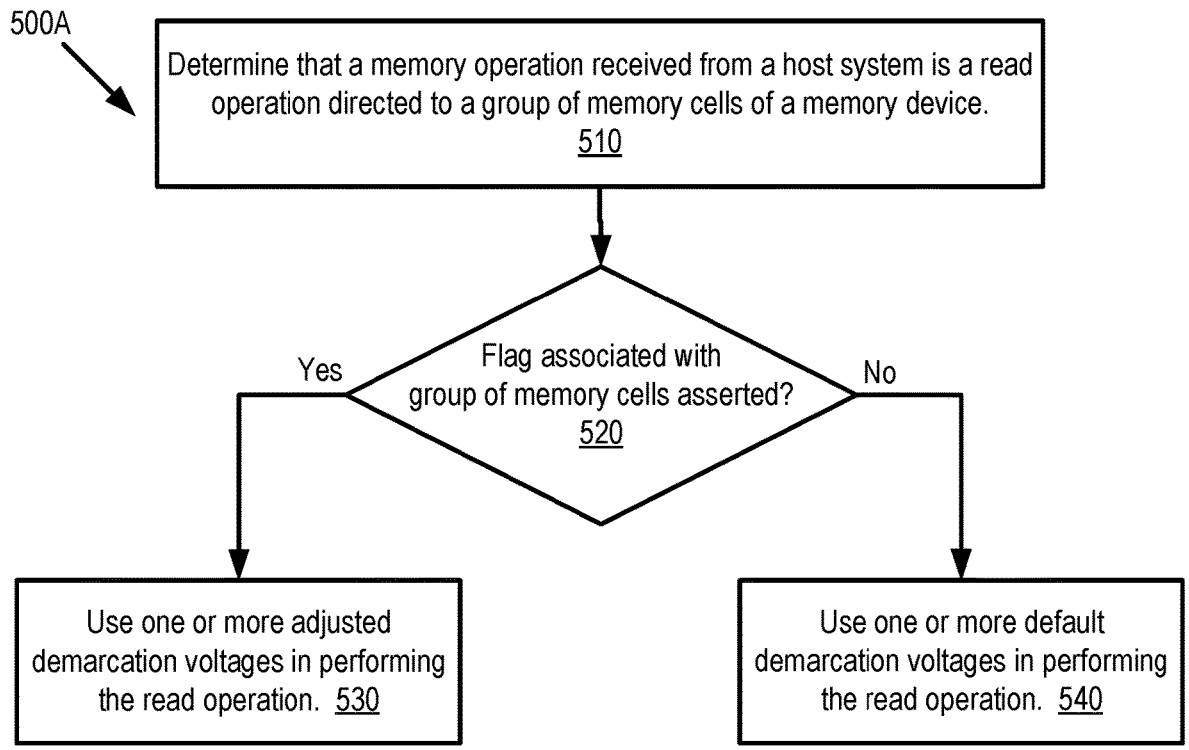
FIG. 5A is a flow diagram of an example method for employing a flag to determine whether to use adjusted or default demarcation voltages in performing a read operation at a group of memory cells in accordance with some embodiments.

FIG. 5A is a flow diagram of an example method 500A for employing a flag to determine whether to use adjusted or default demarcation voltages in performing a read operation at a group of memory cells in accordance with some embodiments. The method 500A can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500A is performed by the memory operation voltage manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 510, the processing logic determines that a memory operation received from a host system is a read operation directed to a group of memory cells of a memory device.

At operation 520, the processing logic determines whether a flag associated with the group of memory cells is asserted.

At operation 530, the processing logic, in response to the flag being asserted, uses one or more adjusted demarcation voltages associated with the group of memory cells in performing the read operation.

At operation 540, the processing logic, in response to the flag not being asserted, using one or more default demarcation voltages in performing the read operation.

In furtherance of the method 500A, the processing logic can also determine that a second memory operation received from a host system is a write operation directed to a second group of memory cells of the memory device; determines that a second flag associated with the second group of memory cells is asserted; and deasserts the second flag in addition to performing the write operation.

In furtherance of the method 500A, the processing can further determine that a third memory operation received from the host system is a second read operation and is directed to the second group of memory cells; determine that the second flag associated with the second group of memory cells is not asserted; and perform the second read operation using one or more default demarcation voltages.

Figure 5B:
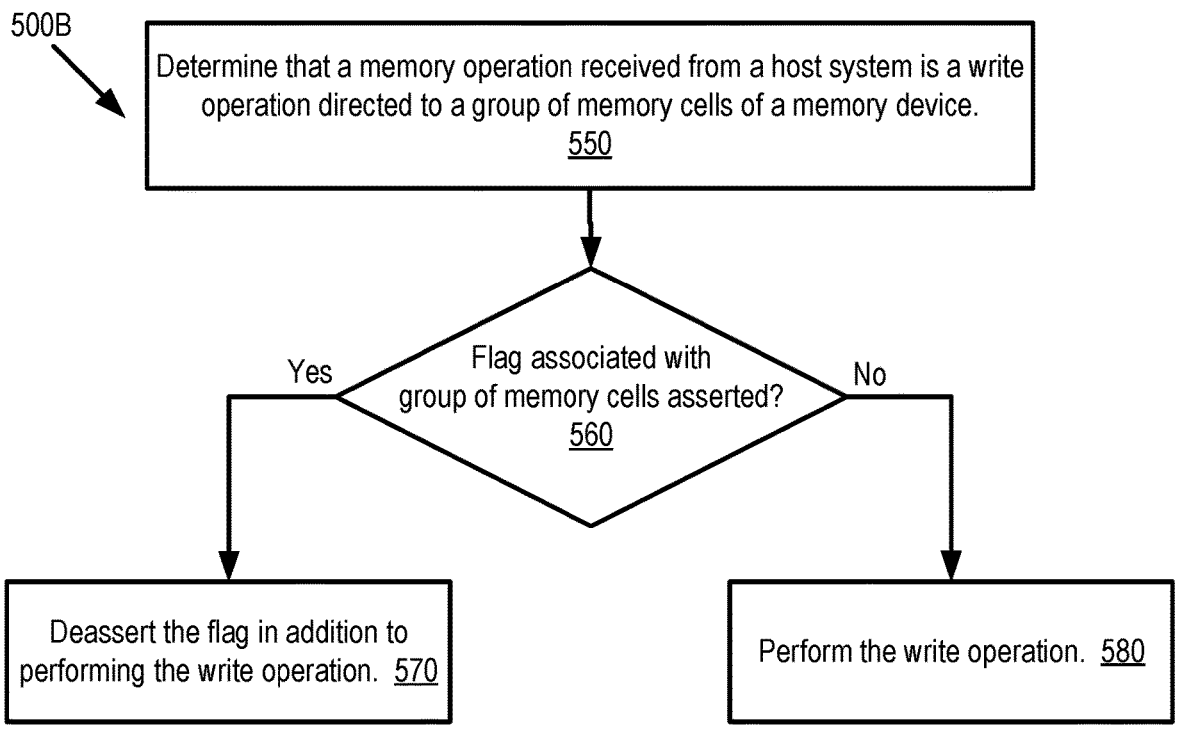
FIG. 5B is a flow diagram of an example method for determining whether to deassert a flag associated with a group of memory cells when performing a write operation at the group of memory cells in accordance with some embodiments.

FIG. 5B is a flow diagram of an example method 500B for determining whether to deassert a flag associated with a group of memory cells when performing a write operation at the group of memory cells in accordance with some embodiments. The method 500B can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500B is performed by the memory operation voltage manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 550, the processing logic determines that a memory operation received from a host system is a write operation directed to a group of memory cells of a memory device.

At operation 560, the processing logic determines whether a flag associated with the group of memory cells is asserted.

At operation 570, the processing logic, in response to the flag being asserted, deasserts the flag in addition to performing the write operation.

At operation 580, the processing logic, in response to the flag not being asserted, performs the write operation.

In furtherance of method 500B, the processing logic can also determine that a second memory operation received from a host system is a read operation directed to a second group of memory cells of the memory device; determines that a second flag associated with the group of memory cells is asserted; and performs the read operation using the one or more adjusted demarcation voltages.

In furtherance of the method 500B, the processing logic can further determine that a second memory operation received from a host system is a read operation directed to the group of memory cells of the memory device; determine that the flag associated with the group of memory cells is not asserted; and perform the read operation using one or more default voltage demarcation voltages.

Figure 6:
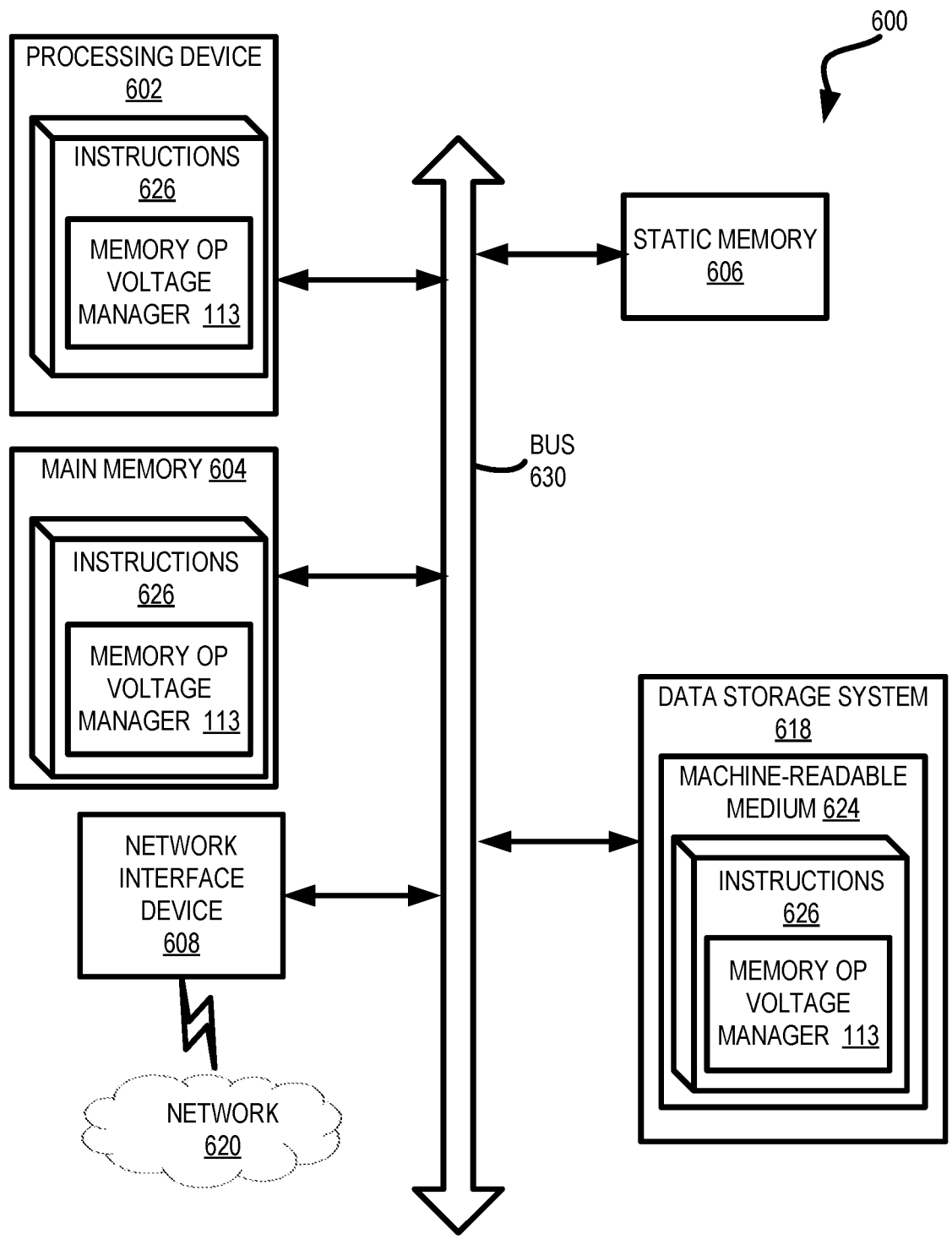
FIG. 6 is a block diagram of an example computer system in which embodiments of the present disclosure may operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the read and memory operation voltage manager 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or RDRAM, etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a read and write voltage managing component (e.g., the memory operation voltage manager 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
   a memory device including a plurality of memory cells; and
   a processing device, operatively coupled to the memory device, the processing device to perform operations comprising:
   determining a length of time the memory device has been powered off; and
   in response to determining that the length of time satisfies a threshold criterion:
   for each group of a plurality of groups of memory cells, asserting a flag that corresponds to a respective group of the plurality of groups of memory cells;
   determining, based on the length of time, an adjusted demarcation voltage to be used in reading a state of memory cells within each of the plurality of groups of memory cells; and
   in response to receipt of a read operation directed to a group of memory cells of the plurality of groups of memory cells:
   determining that a flag associated with the group of memory cells is asserted; and
   performing the read operation using the adjusted demarcation voltage that was determined for the group of memory cells.

2. The system of claim 1, wherein each flag is stored within one of a local memory or a register of the processing device.

3. The system of claim 1, wherein determining the length of time the memory device has been powered off comprises accessing a system-level time stamp, wherein the operations further comprise storing the adjusted demarcation voltage that is determined for each of the plurality of groups of memory cells for use in future memory operations.

4. The system of claim 1, wherein each group of the plurality of groups of memory cells is one of a page or a physical block of memory cells.

5. The system of claim 1, wherein the operations further comprise performing the read operation using a default demarcation voltage in response to determining that the flag in not asserted.

6. The system of claim 1, wherein the operations further comprise, in response to receipt of a write operation directed at a second group of memory cells of the plurality of groups of memory cells:
   determining that a second flag, which is associated with the second group of memory cells, is asserted;
   deasserting the flag; and
   performing the write operation.

7. The system of claim 6, wherein the operations further comprise, in response to a second read operation directed at the second group of memory cells:
   determining that the flag is not asserted; and
   performing the second read operation using one or more default demarcation voltages.

8. The system of claim 1, wherein determining the adjusted demarcation voltage to be used for reading each state of the plurality of groups of memory cells comprises one of:
   accessing a discontinuous curve that correlates power-off time of the memory device to a set of discrete demarcation voltages; or
   accessing a continuous curve that correlates power-off time of the memory device to demarcation voltages located along the continuous curve.

9. A method comprising:
   determining a length of time a memory device has been powered off; and
   in response to determining that the length of time satisfies a threshold criterion:
   for each group of a plurality of groups of memory cells, asserting a flag flag that corresponds to a respective group of the plurality of groups of memory cells;
   determining, by a processing device, based on the length of time, an adjusted demarcation voltage to be used in reading a state of memory cells within each of the plurality of groups of memory cells; and
   determining that a flag associated with the group of memory cells is not asserted; and
   performing the read operation using a default demarcation voltage.

10. The method of claim 9, further comprising:
    determining whether the flag associated with the group of memory cells is asserted; and
    in response to the flag being asserted, using the adjusted demarcation voltage associated with the group of memory cells in performing the read operation.

11. The method of claim 9, wherein determining the length of time the memory device has been powered off comprises accessing a system-level time stamp, the method further comprising storing the adjusted demarcation voltage that is determined for each of the plurality of groups of memory cells for use in future memory operations.

12. The method of claim 9, wherein each group of memory cells of the plurality of groups of memory cells is one of a page or a physical block of memory cells.

13. The method of claim 9, further comprising, in response to receipt of a write operation directed at a second group of memory cells of the plurality of groups of memory cells:
- determining that a second flag, which associated with the second group of memory cells, is asserted;
- deasserting the second flag; and
- performing the write operation.

14. The method of claim 13, further comprising, in response to a second read operation directed at the second group of memory cells:
- determining that the second flag is not asserted; and
- performing the second read operation using one or more default demarcation voltages.

15. A method comprising:
- determining a length of time a memory device has been powered off; and
- in response to determining that the length of time satisfies a threshold criterion:
  - for each group of a plurality of groups of memory cells, asserting a flag that corresponds to a respective group of the plurality of groups of memory cells;
  - determining, based on the length of time, an adjusted demarcation voltage to be used in reading a state of memory cells within each of the plurality of groups of memory cells; and
- in response to receipt of a write operation directed to a group of memory cells of the plurality of groups of memory cells:
  - determining that a flag associated with the group of memory cells is asserted; and
  - deasserting the flag before performing the write operation.

16. The method of claim 15, further comprising in response to the flag associated with the group of memory cells not being asserted, performing the write operation.

17. The method of claim 15, wherein determining the length of time the memory device has been powered off comprises accessing a system-level time stamp, the method further comprising storing the adjusted demarcation voltage that is determined for each of the plurality of groups of memory cells for use in future memory operations.

18. The method of claim 15, wherein each group of the plurality of groups of memory cells is one of a page or a physical block of memory cells.

19. The method of claim 15, further comprising, in response to receipt of a read operation directed to a second group of memory cells of the plurality of groups of memory cells:
- determining that a second flag, associated with the second group of memory cells, is asserted; and
- performing the read operation using the adjusted demarcation voltage that was determined for the second group of memory cells.

20. The method of claim 15, further comprising, in response to receipt of a read operation directed to the group of memory cells:
- determining that the flag is not asserted; and
- performing the read operation using one or more default voltage demarcation voltages.

* * * * *

UNITED STATES PATENT AND TRADEMARK OFFICE
CERTIFICATE OF CORRECTION

PATENT NO. : 11,756,597 B2
APPLICATION NO. : 17/393112
DATED : September 12, 2023
INVENTOR(S) : Mikai Chen et al.

Page 1 of 1

It is certified that error appears in the above-identified patent and that said Letters Patent is hereby corrected as shown below:

In the Claims

In Claim 9, Column 14, Line 46, after "asserting a" delete "flag"

Signed and Sealed this
Tenth Day of October, 2023

Katherine Kelly Vidal
*Director of the United States Patent and Trademark Office*